(12) United States Patent
Hoshino et al.

(10) Patent No.: US 7,489,522 B2
(45) Date of Patent: Feb. 10, 2009

(54) CASE FOR ELECTRONIC EQUIPMENT AND COMMUNICATION DEVICE

(75) Inventors: Tsutomu Hoshino, Yamanashi (JP); Akira Sugiyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 591 days.

(21) Appl. No.: 11/213,958

(22) Filed: Aug. 30, 2005

(65) Prior Publication Data

US 2006/0044775 A1    Mar. 2, 2006

(30) Foreign Application Priority Data

Aug. 31, 2004  (JP) ............................. P2004-252438

(51) Int. Cl.
*H05K 7/14* (2006.01)
*H05K 5/02* (2006.01)
(52) U.S. Cl. .................. 361/797; 361/796; 361/756; 361/741; 361/730; 361/683; 174/520
(58) Field of Classification Search ............... 361/679, 361/683, 724, 725, 730, 741, 752, 756, 796, 361/797, 802; 174/521; 211/41.17
See application file for complete search history.

(56) References Cited

U.S. PATENT DOCUMENTS

| | | | | |
|---|---|---|---|---|
| 6,038,126 A * | 3/2000 | Weng | ........................... | 361/679 |
| 6,166,917 A * | 12/2000 | Anderson | .................... | 361/756 |
| 6,195,262 B1 * | 2/2001 | Bodette et al. | .............. | 361/752 |
| 6,198,633 B1 * | 3/2001 | Lehman et al. | ............. | 361/756 |
| 6,229,710 B1 * | 5/2001 | Chen | ........................... | 361/759 |
| 6,771,516 B1 * | 8/2004 | Leman et al. | ............... | 361/825 |
| 6,894,906 B2 * | 5/2005 | Sivertsen | .................... | 361/796 |
| 6,999,319 B2 * | 2/2006 | Wu et al. | ..................... | 361/724 |
| 7,099,160 B1 * | 8/2006 | Ice | ............................. | 361/802 |
| 7,167,380 B2 * | 1/2007 | Ice | ............................. | 361/796 |
| 7,210,586 B2 * | 5/2007 | Ice | ............................. | 211/26 |

FOREIGN PATENT DOCUMENTS

| | | |
|---|---|---|
| JP | 4-53035 | 2/1992 |
| JP | 2003-101263 | 4/2003 |

* cited by examiner

*Primary Examiner*—Dean A. Reichard
*Assistant Examiner*—Dameon E. Levi
(74) *Attorney, Agent, or Firm*—Finnegan, Henderson, Farabow, Garrett & Dunner, L.L.P.

(57) ABSTRACT

A case for electronic equipment includes: a chassis that includes at least a bottom plate of an enclosure having a box-shaped outer shell; a stay that holds a motherboard perpendicularly with respect to the bottom plate; guide members that are provided with slots for guiding a substrate unit to be perpendicularly plugged into the motherboard by way of a connector, the guide members being disposed on both sides for guiding the substrate unit, and being configured to pull out integrally with the motherboard towards a plug-in side from which the substrate unit is plugged in; and a cover that includes at least a top cover side of the enclosure except for a portion corresponding to the bottom plate and a portion corresponding to the plug-in side.

11 Claims, 8 Drawing Sheets

CASE FOR ELECTRONIC EQUIPMENT AND COMMUNICATION DEVICE

RELATED APPLICATIONS

The present disclosure relates to the subject matter contained in Japanese Patent Application No. 2004-252438 filed on Aug. 31, 2004, which is incorporated herein by reference in its entirety.

BACKGROUND OF THE INVENTION

1. Field of the Invention

The present invention relates to a case for electronic equipment for containing electronic equipment in which a substrate unit is perpendicularly plugged into a motherboard by way of a connector, as well as to a communication device which selectively employs, for connection of a communication cable, a telecommunication wiring mode and a LAN wiring mode.

2. Description of the Related Art

Some electronic equipment is configured such that a substrate unit is perpendicularly plugged into a motherboard by way of a connector. In the electronic equipment, the motherboard is fixed to the inside of an enclosure. In particular, JP-A-2003-101263 discloses a configuration in which a motherboard is placed horizontally, and a plurality of expansion boards, which are disposed upright on an expansion unit, are attached to and detached from the motherboard. The expansion unit attaches and detaches all the expansion boards to and from the motherboard simultaneously. The expansion boards are guided on guide rails provided inside the enclosure, to thus be inserted and removed by way of an attachment opening formed in a front-side plate of the enclosure.

An enclosure for electronic equipment disclosed in JP-A-4-053035 is configured such that a motherboard is disposed at a deeper side, and guide rails are disposed on an inner top face and inner bottom face thereof. A panel to be plugged-in the motherboard is guided on the guide rails in an upright position to thus be inserted from the near side.

SUMMARY OF THE INVENTION

However, in the above-mentioned electronic equipment, a portion of an enclosure, such as a cover, to which the motherboard is not directly fixed must be removed for performing checking and testing of a connecting state and an operating state of respective substrate units in a state in which substrate units, such as an expansion board and a panel, are plugged into a motherboard and are operating.

Incidentally, in association with diversification of communication method, a variety of connectors and connecting terminals have been adopted. In particular, wiring modes for communication devices are primarily classified into two modes; a telecommunication wiring mode and a LAN (local area network) wiring mode. In the telecommunication wiring mode, electric equipment is often configured such that wiring connector terminals are disposed inside an enclosure, and wiring is carried out with a cover of the enclosure removed. In the LAN wiring mode, electric equipment is often configured such that wiring connector terminals are disposed on an external face of an enclosure, and wiring is carried out without removal of a cover of the enclosure.

However, in either mode, when a substrate unit is attached to a motherboard in an existing communication device or when maintenance is performed, the work must be conducted with the cover open. In addition, the telecommunication wiring mode and the LAN wiring mode have been employed separately. However, since products adapting the IPs (internet protocols) have been increased in number, these wiring modes have come to be mixed more and more often. Accordingly, supporting these wiring modes by a single set of electronic equipment has been desired. Even when having a single feature, a substrate unit to be added in conformance with specifications of electronic equipment requires different connectors.

The present invention provides a case for electronic equipment which attains excellent workability such that connection of a substrate unit to a motherboard and checking of operations under a plugged-in state can be effected easily without opening a cover of the enclosure, as well as a communication device which can support different wiring modes.

According to a first aspect of the invention, there is provided a case for electronic equipment including: a chassis that includes at least a bottom plate of an enclosure having a box-shaped outer shell; a stay that holds a motherboard perpendicularly with respect to the bottom plate; guide members that are provided with slots for guiding a substrate unit to be perpendicularly plugged into the motherboard by way of a connector, the guide members being disposed on both sides for guiding the substrate unit, and being configured to pull out integrally with the motherboard towards a plug-in side from which the substrate unit is plugged in; and a cover that includes at least a top cover side of the enclosure except for a portion corresponding to the bottom plate and a portion corresponding to the plug-in side.

According to a second aspect of the invention, there is provided a case for electronic equipment including: a chassis that includes at least a bottom plate of an enclosure having a box-shaped outer shell; a tray that is placed on the bottom plate and configured to be displaceable to be pulled to an outside of the enclosure along the bottom plate; a stay that is fixed on the tray and supports a motherboard disposed perpendicularly with respect to a pulling direction of the tray; guide members that are provided with slots for guiding a substrate unit to be perpendicularly plugged into the motherboard by way of a connector, the guide members being disposed on both sides for guiding the substrate unit and being fixed to the tray; and a cover that includes at least a top cover side of the enclosure except for a portion corresponding to the bottom plate and a portion corresponding to the pulling direction side of the tray.

According to a third aspect of the invention, there is provided a case for electronic equipment including: a box-shaped outer shell that accommodates an electronic equipment in which a substrate unit is perpendicularly plugged into a motherboard by way of a connector; a chassis that includes a bottom plate of the outer shell; guide members that are provided with slots for guiding the substrate unit to the motherboard disposed perpendicularly with respect to the bottom plate, the guide members being configured to move in conjunction with the motherboard along a plug-in direction of the substrate unit; and a cover that includes a portion of the outer shell, except for a portion corresponding to a bottom plate side and a portion corresponding to a plug-in direction side of the substrate unit, the cover covering the motherboard and the substrate unit.

According to a fourth aspect of the invention, there is provided a communication device including: a chassis that includes at least a bottom plate of an enclosure having a box-shaped outer shell; a tray that is placed on the bottom plate and configured to be displaceable to be pulled to an outside of the enclosure along the bottom plate; a cover that includes at least a top cover side of the enclosure except for a portion corresponding to the bottom plate and a portion corresponding to the pulling direction side of the tray; a motherboard that is disposed perpendicularly with respect to the pulling direction of the tray; a stay that is fixed to the tray and supports the motherboard; a substrate unit that is perpendicularly plugged into the motherboard by way of a connector; guide members that are provided with slots for guiding the substrate unit, the guide members being disposed on both sides for guiding the substrate unit and being fixed to the tray; a panel that is attached to a position between a pair of the guide members corresponding to the single substrate unit, the panel individually covering a plug-in section of the substrate unit; a front cover that is formed to edge around the panel and is attached to the enclosure from outside of the panels; a sealing plate that is disposed on the guide member located at an insertion end side, opposite the motherboard, the sealing plate preventing insertion in a direction crossing the guide member; and a notch that is formed at a position corresponding to the sealing plate located closer to the front cover, the notch establishing mutual communication between an inside and an outside of the enclosure, wherein the panel is provided with an opening that allows, when a communication cable is connected to the substrate unit to be connected to the motherboard from the front cover side, viewing of a connecting terminal into which a jack of the communication cable is to be plugged, and wherein when a communication cable extending from the substrate unit connected to the motherboard is drawn to the outside of the enclosure in a direction crossing the plug-in direction of the substrate unit, the communication cable is wired so as to cross over the guide member and the notch in a state in which the sealing plate is removed.

DETAILED DESCRIPTION OF THE EMBODIMENT

A case for electronic equipment of an embodiment according to the invention will be described by reference FIGS. 1 to 12 and an example case where the structure is applied to a communication device 1.

Figure 1:
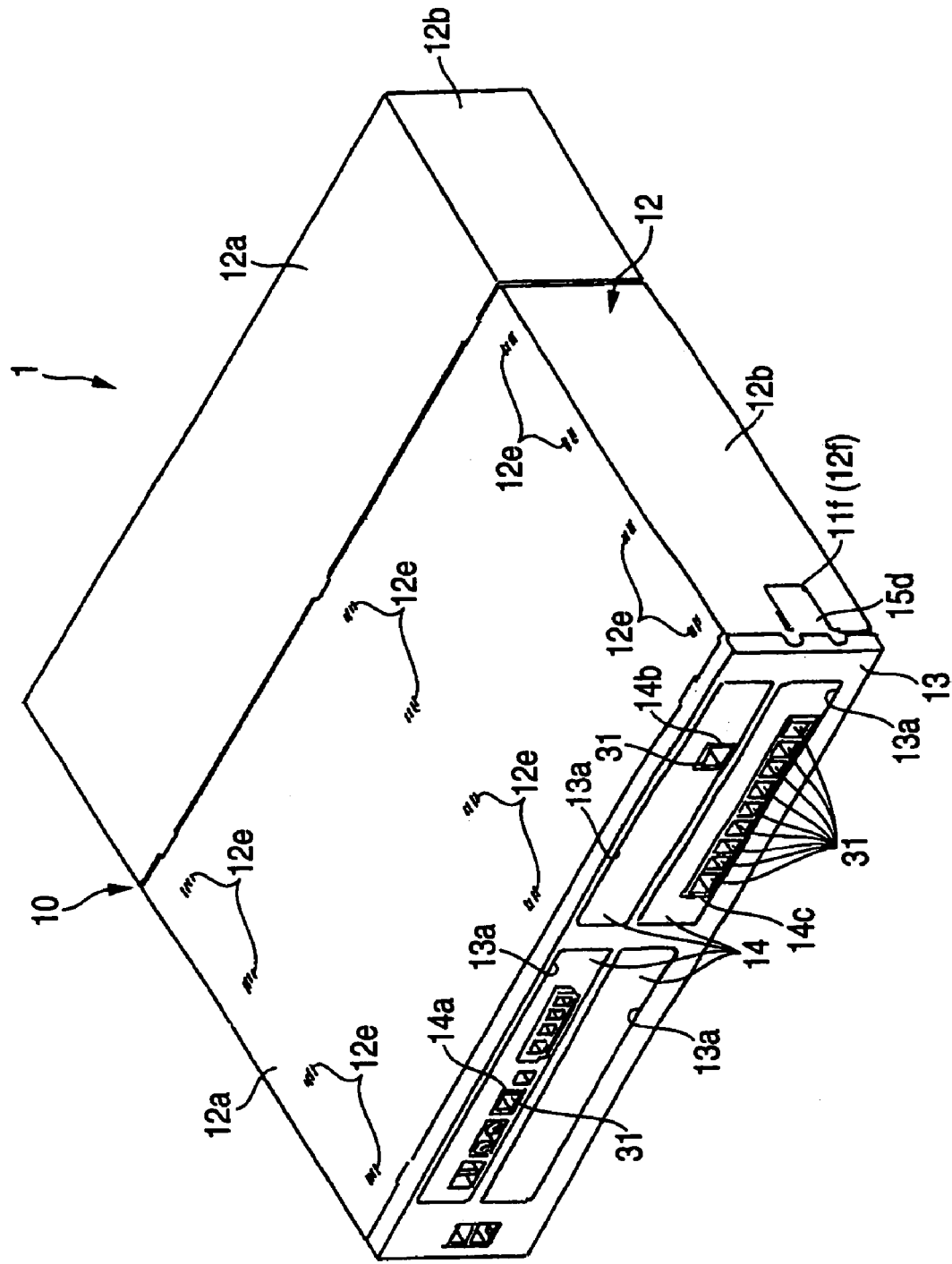
FIG. 1 is a perspective view showing a communication device having an electronic equipment enclosure of an embodiment and being LAN wired.

An enclosure 10 of the communication device 1 shown in FIG. 1 has a box-shaped outer shell. A grid-like front cover 13 is attached to a front face of the enclosure 10. A panel 14 is attached to inside of each window 13a of the grid. The panels 14 have openings 14a, 14b, and 14c, through which connecting terminals 31—which are respectively disposed on substrate units 21, 22, 23, and 24—can be viewed. The substrate units 21, 22, 23, and 24 are incorporated in the enclosure 10.

The communication device 1 shown in FIG. 1 is LAN-wired. The majority of LAN wiring is carried out with use of a communication cable 51 having an 8-pin modular jack 41. Therefore, the plurality of connecting terminals 31, to each of which the communication cable 51 for the 8-pin modular jack 41 is connected, are disposed on the front face of the enclosure 10.

Figure 2:
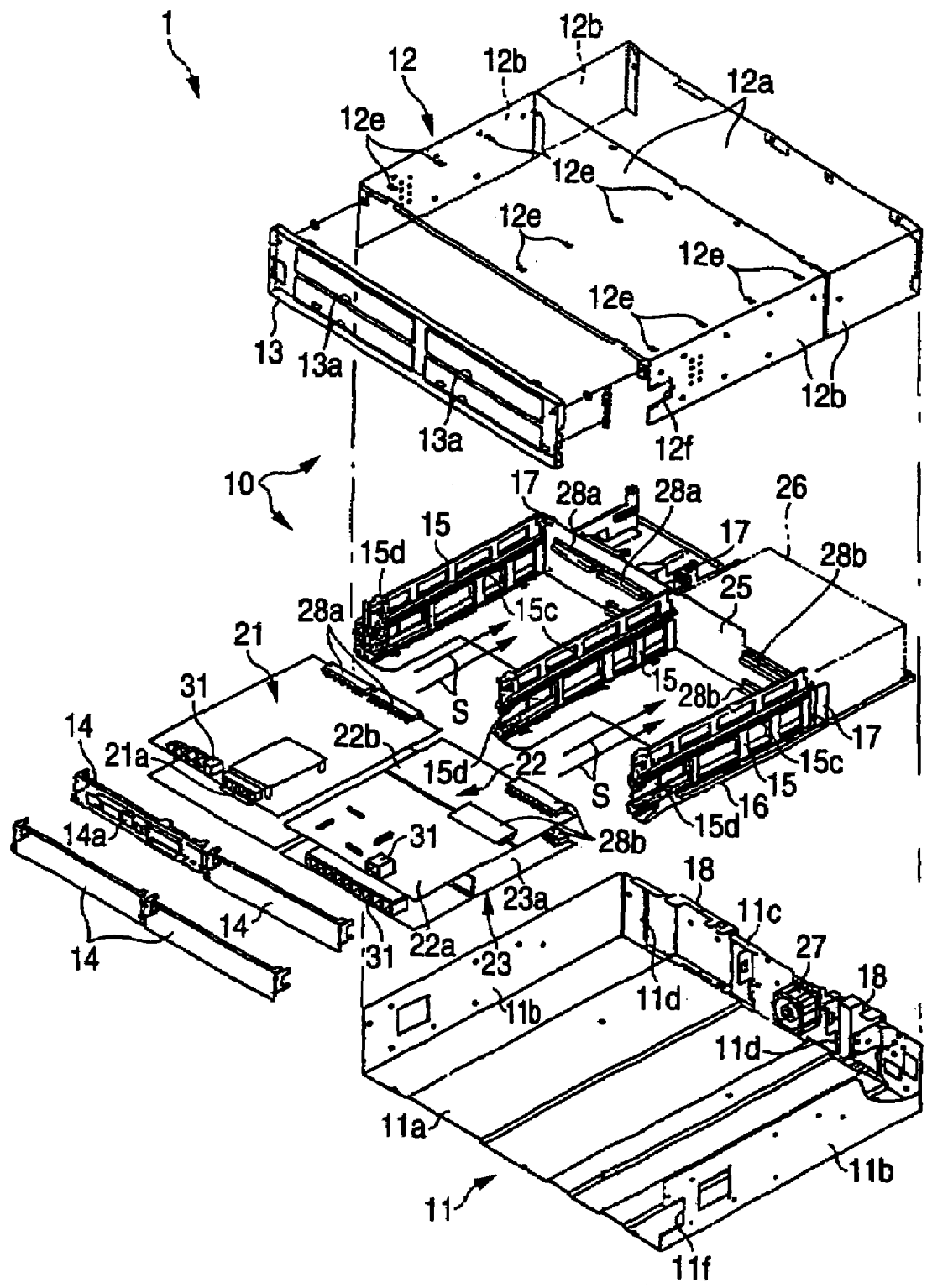
FIG. 2 is an exploded perspective view of the communication device shown in FIG. 1.

As shown in FIG. 2, the communication device 1 is configured such that a motherboard 25, the substrate units 21, 22, 23, and 24, and a power supply unit 26 are incorporated in the enclosure 10. Hereinbelow, for convenience of explanation, a side from which the connecting terminals 31 are visible is defined as a front side or a plug-in side, and a side where the power supply unit 26 is mounted is defined as a rear side; and a vertical direction is defined in a state in which the communication device 1 is installed, and a lateral direction is defined as viewed from the front side.

The enclosure 10 has a chassis 11, a tray 16, stays 17, guide members 15, a cover 12, the panels 14, and the front cover 13. The chassis 11 has a bottom wall 11a, chassis side walls 11b, and a rear wall 11c, which are integrally press-formed. The bottom wall 11a constitutes a bottom plate of the enclosure 10. A back cover 18 for sealing a rear opening 11d; and a fan 27 for air-cooling the power supply unit 26, the motherboard 25, and the like, are attached to the rear wall 11c.

Figure 3:
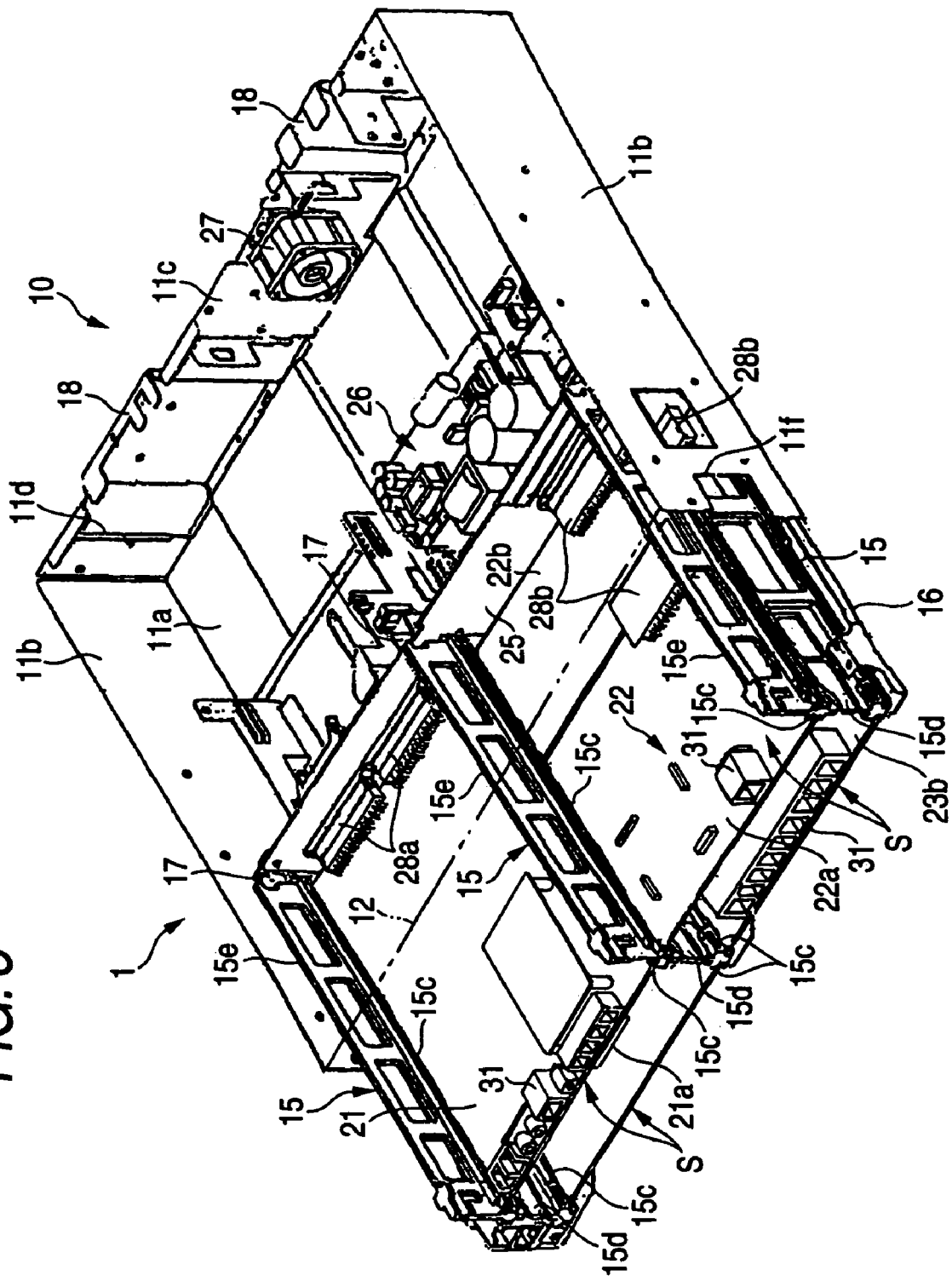
FIG. 3 is a perspective view of the communication device shown in FIG. 1, showing a state in which a front cover and panels are removed and a cover is omitted with a tray being pulled forward.

A tray 16, which is placed on the bottom wall 11a, can be slid frontward of the enclosure 10 along the bottom wall 11a as shown in FIG. 3. The stays 17 are fixed to the tray 16. The stays 17 support the motherboard 25 disposed perpendicularly with respect to the pulling direction of the tray 16. The power supply unit 26 is mounted to the rear of the motherboard 25 on the tray 16.

Figure 5:
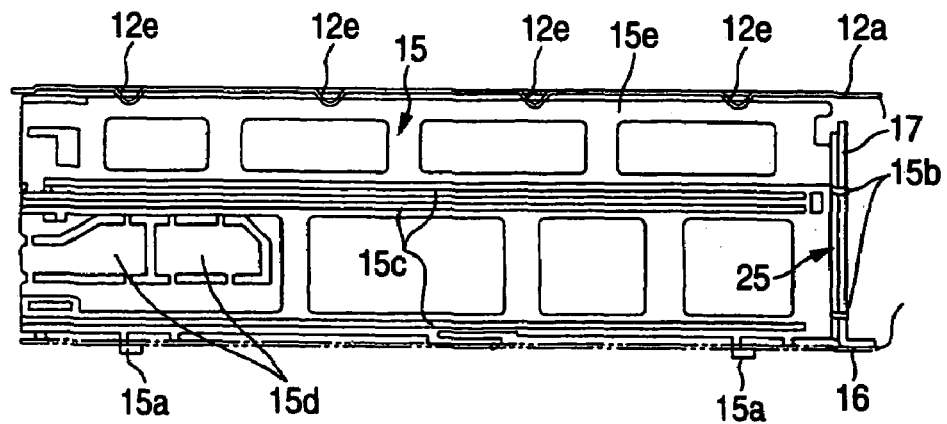
FIG. 5 is a side view of a guide member shown in FIG. 2.
Figure 6:
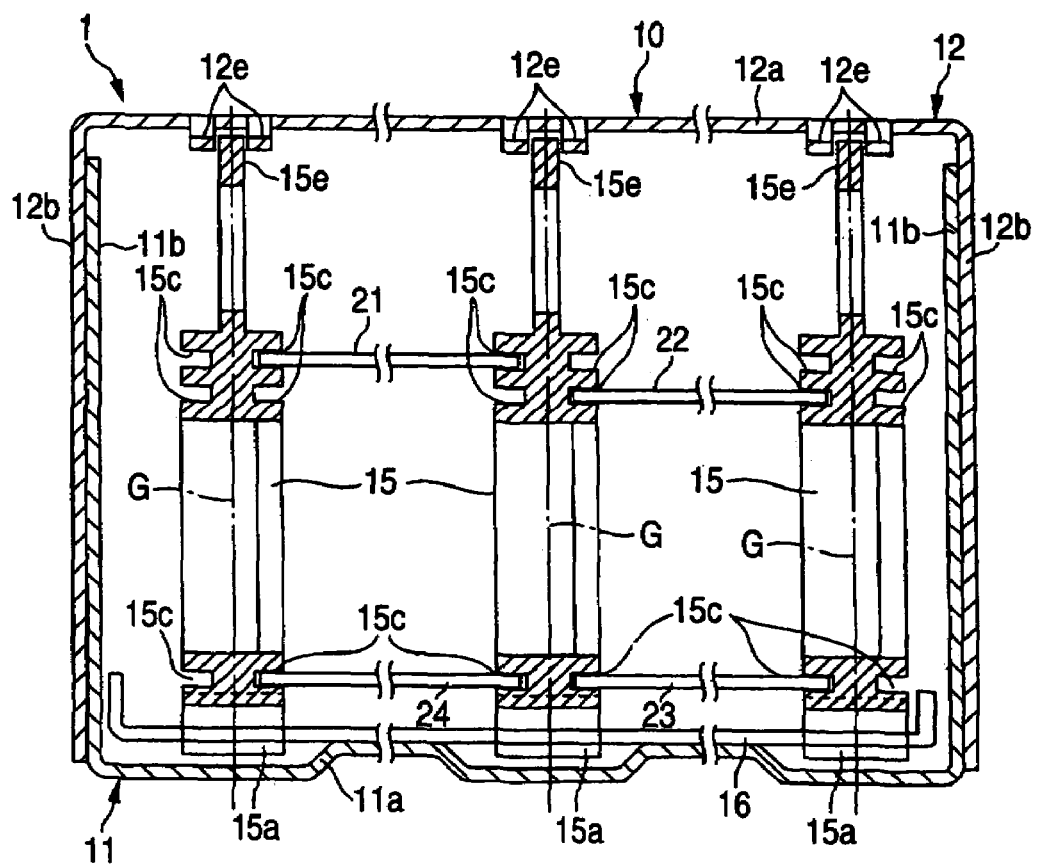
FIG. 6 is a cross-sectional view taken so as to cross the substrate unit parallel with a motherboard of the communication device shown in FIG. 1.
Figure 7:
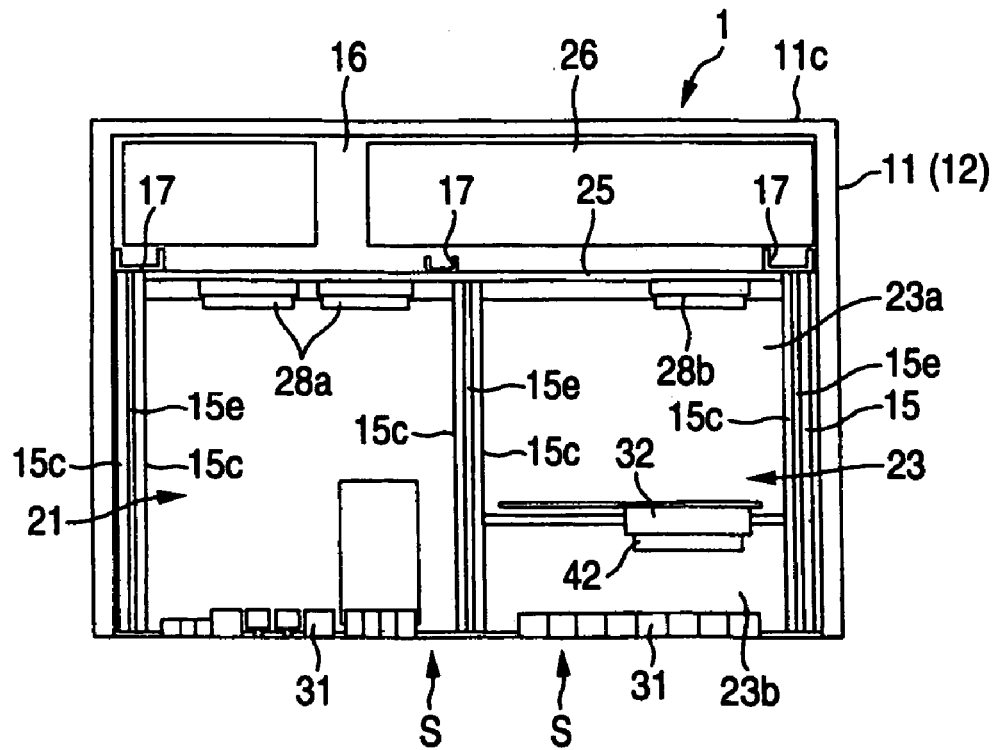
FIG. 7 is a plan view schematically showing the communication device shown in FIG. 1, showing a state in which the cover is removed.

The guide members 15 are disposed on opposite sides of the substrate units 21, 22, 23, and 24 for guiding the same. As shown in FIG. 5, each of the guide members 15 is engaged in the tray 16 by a hook 15a disposed on a lower edge of the guide member 15. A projection 15b disposed on the rear end of guide member 15 is inserted in the motherboard 25 or in the stay 17. The respective guide members 15 are of identical shape. The guide members 15 have slots 15c for guiding the substrate units 21, 22, 23, and 24. As shown in FIG. 6, the slots 15c are disposed so as to form a mirror image with respect to guide center planes G which are perpendicular to planes extending along the substrate units 21, 22, 23, and 24; that is, the slots 15c are bilaterally symmetrical. At least one slot 15c is disposed on either side face of the guide member 15 extending in a direction in which the substrate units 21, 22, 23, and 24 are inserted. In the embodiment, one slot 15c is disposed at a position close to the lower end of one side face of the guide member 15, and two slots 15c are disposed in the vicinity of a center section in parallel therewith; that is, three slots 15c in total are disposed for each of the guide members 15.

In addition, each of the guide members 15 has a sealing plate 15d at a position opposite the motherboard 25; namely, a front section which serves as an insertion end of each of the substrate units 21, 22, 23, and 24. The sealing plate 15d is a partition for separating plug-in sections S which are adjacent to each other, and blocks insertion in a direction crossing the guide member 15. The sealing plate 15d is connected to the guide member 15 at several points, and can be cut out easily with a nipper, or the like. The sealing plate 15d is also effective for preventing a finger from unintentionally touching the substrate unit 21, 22, 23, or 24 at a time of pulling out the tray 16.

The cover 12 has a top plate 12a and cover side walls 12b. The cover 12 is divided into a front section and a rear section at a boundary located in the vicinity of the motherboard 25 in a state in which the tray 16 is enclosed in the enclosure 10. The top plate 12a constitutes a top cover of the enclosure 10. Each of the cover side walls 12b is provided so as to overlap one of the chassis side walls 11b from the outer side. Each side wall of the enclosure 10 is configured such that the chassis side wall 11b and the cover side wall 12b are overlapped. As shown in FIG. 2, a notch 11f is formed in the cover side wall 12b at a position corresponding to the sealing plate 15d, and a notch 12f is formed in the chassis side wall 11b at a position corresponding to the same.

In addition, the cover 12 has, on the top plate 12a, guide projections 12e, which loosely fit in an upper edge 15e of the guide member 15. The guide projection 12e is formed by means of press-forming a portion of the top plate 12a into an inwardly hanging hoop. The guide projection 12e may be formed into another shape formed by means of, for instance, notching a portion of the top plate 12a and bending the same inside; or may be formed such that a rivet or a screw is additionally attached onto the top plate 12a by means of spot welding or the like. The shape of the guide projection 12e is not limited to a projection, and may be formed into a rail shape extending along the pulling direction of the tray 16.

The panels 14 are disposed so as to respectively correspond to the substrate units 21, 22, 23, and 24, which are inserted between the guide members 15. Each of the panels 14 is attached to the guide members 15 supporting the opposite sides of the corresponding substrate unit 21, 22, 23, or 24, and individually covers the plug-in section S into which the substrate unit 21, 22, 23, or 24 is attached. Openings 14a, 14b, and 14c are formed in correspondence with respective positions and shapes of the connecting terminals 31 disposed on the substrate unit 21, 22, 23, and 24. The panels 14 are held, in a state in which the tray 16 is enclosed in the enclosure 10, by the front cover 13 attached to a front edge of the cover 12. The front cover 13 is formed into a grid edging around the panels 14, and fastened to the front end of the cover 12 by means of screws.

By way of connectors 28a and 28b, the substrate units 21, 22, 23, and 24 are perpendicularly plugged into the motherboard 25. In the embodiment, the plug-in sections S for the substrate units 21, 22, 23, and 24 are disposed at four points. One of the substrate units 21, 22, 23, and 24 is a control unit 21 for controlling the remaining substrate units 22, 23, and 24 by way of the motherboard 25. As shown in FIGS. 2, 3, 7, and 8, the control unit 21 is connected to the motherboard 25 by means of the two connectors 28a. In addition to the connecting terminals 31 which are to be LAN wired, sockets in which jacks and plugs are to be plugged are aligned along a front edge of the control unit 21 located on the side opposite the motherboard 25.

Figure 8:
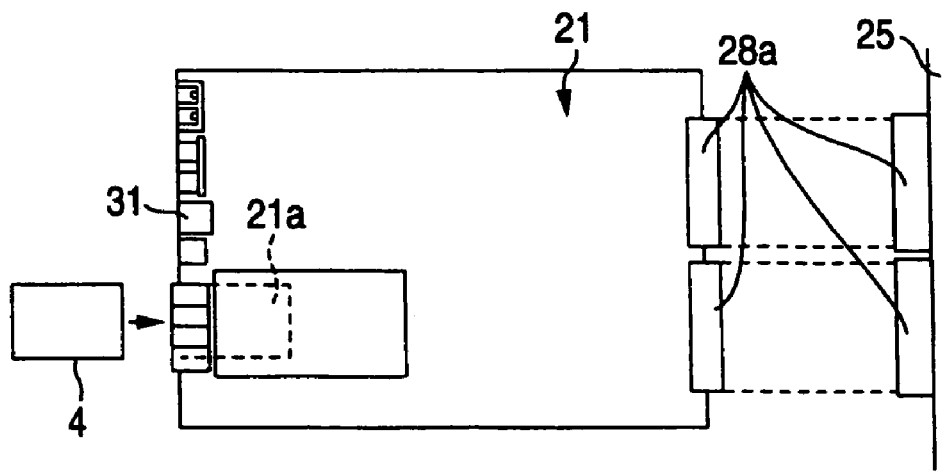
FIG. 8 is a plan view schematically showing a control unit shown in FIG. 2.

A card attachment section 21a which allows plug-in of a memory card, or the like, is disposed in a lower front face of the control unit 21. Accordingly, as shown in FIG. 6, the control unit 21 is plugged in an upper slot 15c among the slots 15c formed in the vicinity of the center section of the guide member 15 so that a card 4 as shown in FIG. 8 can be plugged in the card attachment section 21a in a state in which the front cover 13 is attached.

Figure 9:
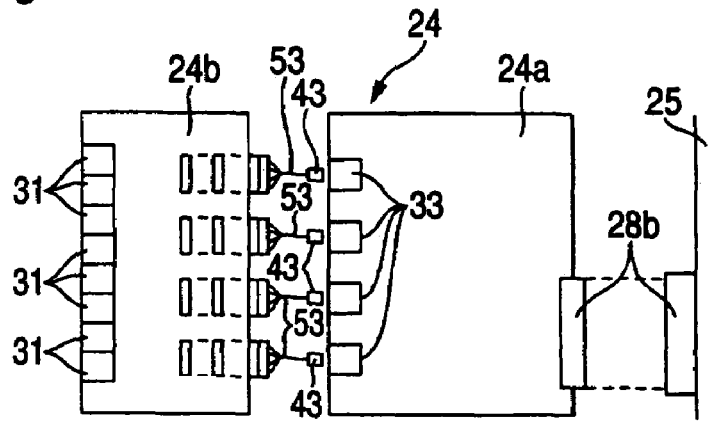
FIG. 9 is a plan view schematically showing one of expansion units shown in FIG. 2.
Figure 10:
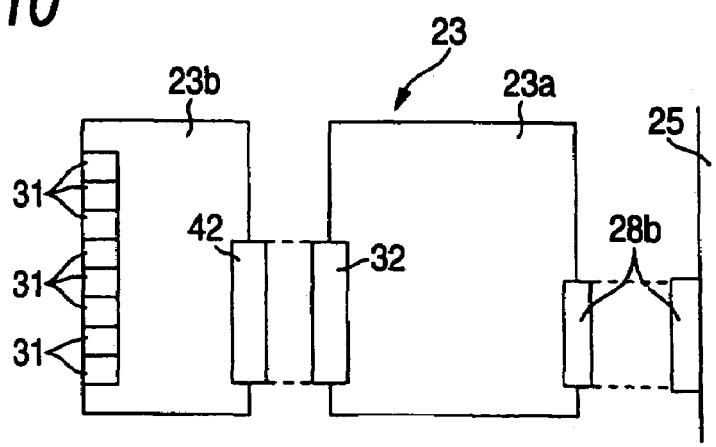
FIG. 10 is a plan view schematically showing one of the expansion units shown in FIG. 2.
Figure 11:
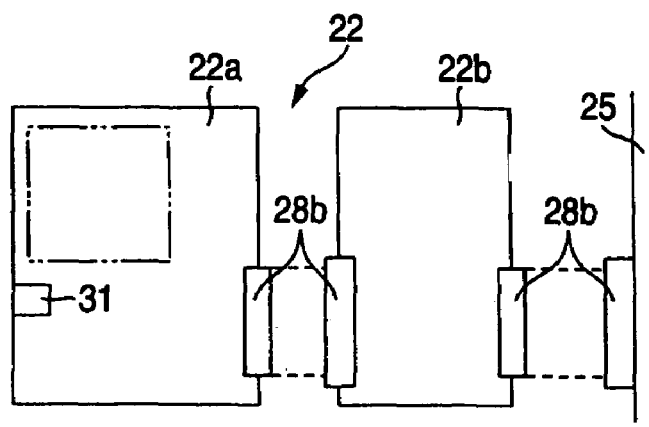
FIG. 11 is a plan view schematically showing one of the expansion units shown in FIG. 2.

As shown in FIGS. 9 to 11, the remaining substrate units 22, 23, and 24 include expansion units 22a, 23a, and 24a which are connected to the motherboard 25 by way of the connectors 28b of identical shape. Accordingly, each of the expansion units 22a, 23a, and 24a may be attached into any plug-in section S other than into the plug-in section S for the control unit 21. As shown in FIGS. 2 to 4 and 7 to 12, the expansion units 22a, 23a, and 24a are formed so as to be shorter than the control unit 21 in the plug-in direction.

Specific examples of connecting terminals 31, 32, and 33 disposed on the expansion unit 22a, 23a, 24a are shown in FIGS. 9 to 11. The expansion unit 24a shown in FIG. 9 has the connecting terminal 33 serving as a receptor into which a 6-pin modular jack 43 can be plugged. The expansion unit 23a shown in FIG. 10 has the connecting terminal 32 for connection with a multi-pin Amphenol connector 42. The expansion unit 22a shown in FIG. 11 has the connecting terminal 31 serving as a receptor into which the 8-pin modular jack 41 can be plugged.

LAN-wiring of the communication device 1 will be described below. As shown in FIGS. 9 to 11, respectively, terminal-converting substrates (auxiliary substrates) 23b, 24b, or an extension substrate (auxiliary substrate) 22b is attached to the expansion units 22a, 23a, and 24a so that the 8-pin modular jack 41 for use in LAN-wiring can be plugged in from the front side as shown in FIGS. 1 to 4 and 7. The terminal-converting substrate 23b, 24b has the connecting terminal 31 into which the 8-pin modular jack 41 is to be inserted; and has such a length that the connecting terminal 31 is located at a position flush with the panel 14 in a state in which the terminal-converting substrate 23b, 24b is inserted in the same slot 15c as the corresponding expansion unit 23a, 24a. The extension substrate 22b has such a length as to be connectively inserted between the expansion unit 22a—having the connecting terminal 31 for the 8-pin modular jack 41—and the motherboard 25 and to place the connecting terminal 31, which is disposed on the corresponding expansion unit 22a, at a position flush with the panel 14.

Figure 4:
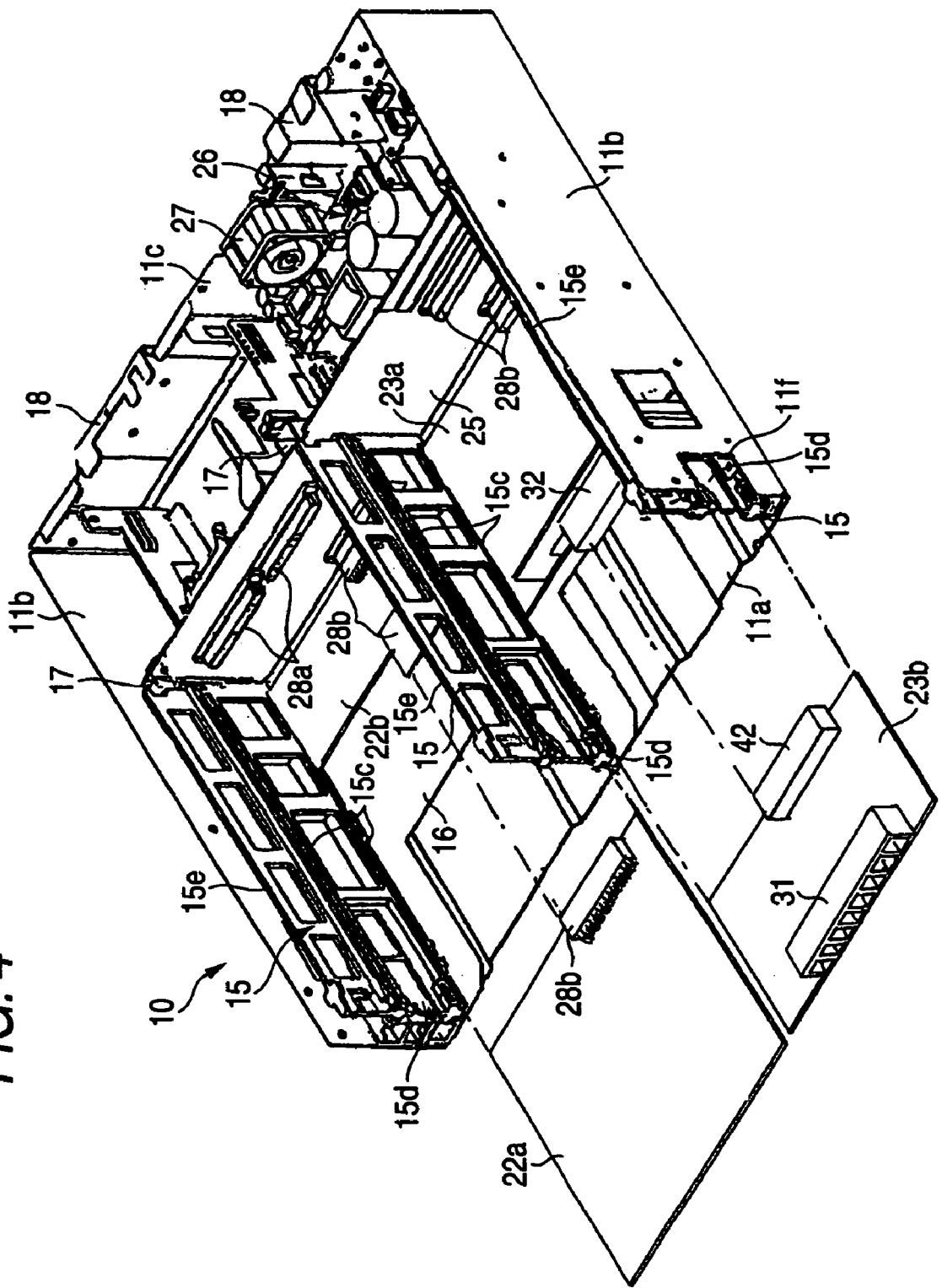
FIG. 4 is a perspective view of the communication device shown in FIG. 1, showing a state in which the front cover and the panels are removed and the cover is omitted, with an expansion unit and a terminal-converting substrate being pulled outside.

FIG. 9 shows that the expansion unit 24a is plugged directly into the motherboard 25, and that the terminal-converting substrate 24b is connected with the expansion unit 24a by way of a communication cable 53 having a 6-pin modular jack 43. FIG. 10 shows that the expansion unit 23a is plugged directly into the motherboard 25, and that the terminal-converting substrate 23b is connected with the connecting terminal 32 of the multi-pin Amphenol connector disposed on the expansion unit 23a. FIG. 11 shows that the expansion unit 22a is connected to the extension substrate 22b having the connector 28b identical in shape with that disposed on the motherboard 25. The extension substrate 22b is plugged into the motherboard 25. Meanwhile, FIG. 4 does not illustrate the connecting terminal 31 of the expansion unit 22a of the substrate unit 22 attached to the plug-in section S on the lower left case, is which is located below the control unit 21. However, a plurality of connecting terminals 31 may be disposed as they are disposed on the terminal-converting substrate 23b, 24b shown in FIG. 9 and 10. Alternatively, a single connecting terminal 31 may be disposed as it is disposed on the expansion unit 22a shown in FIG. 11. Alternatively, when no connecting terminal 31 is disposed, formation of an opening in the panel 14 is negated as is the case with the plug-in section S on the lower left case of the panel 14 in FIG. 1; and connection of an extension substrate between the panel 14 and the motherboard 25 is negated as shown in FIG. 4.

Figure 12:
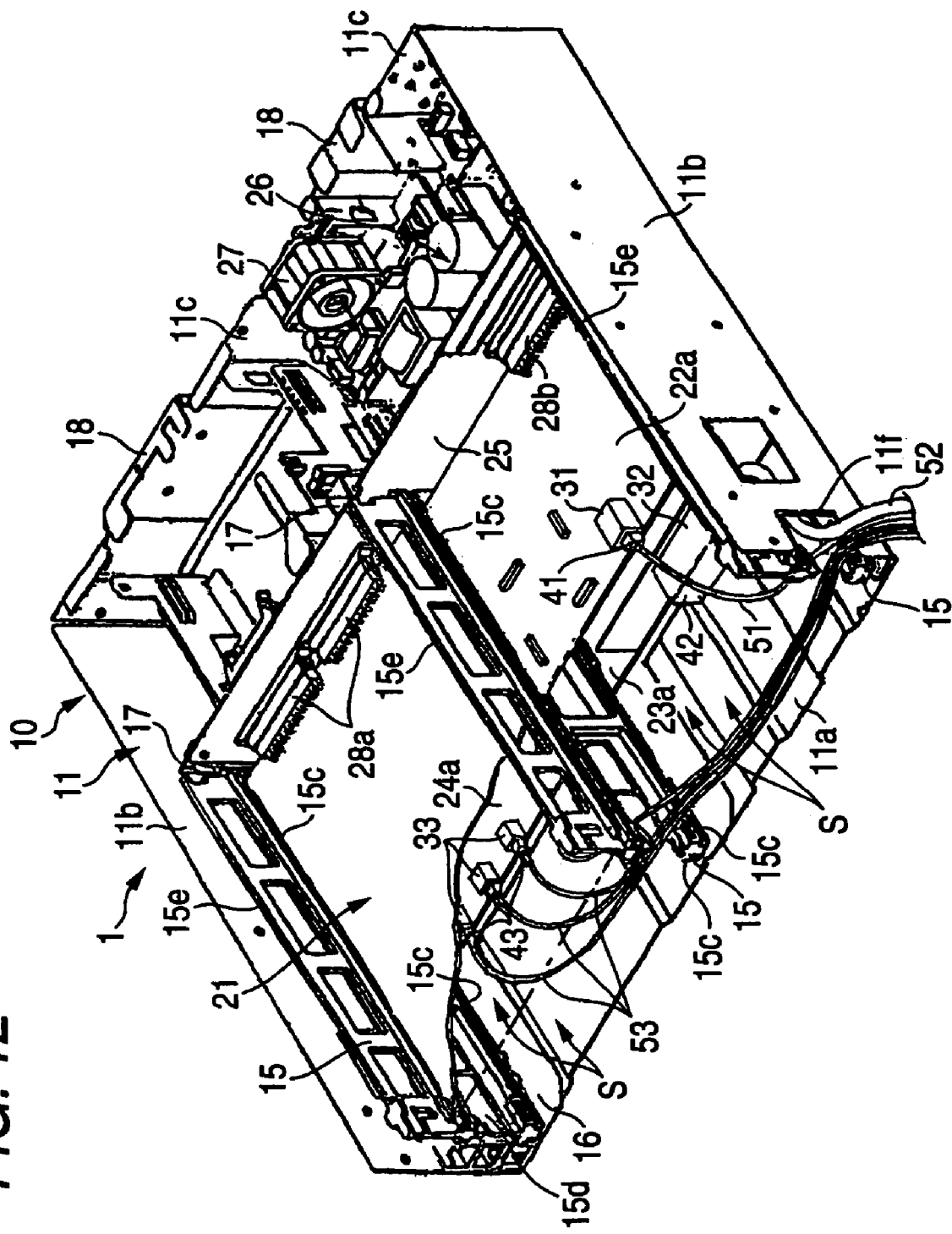
FIG. 12 is a perspective view showing a state in which the communication device shown in FIG. 1 is replaced with tele-communication wiring, with the front cover, the panel, and the cover being omitted, and the control unit being partially cutaway.

Next, telecommunication wiring of the communication device 1 will be described below. The expansion units 22a, 23a, and 24a shown in FIGS. 9 to 11 are connected directly to the motherboard 25. As shown in FIG. 12, the communication cables 51, 52, and 53, each of which has the 8-pin modular jack 41, the multi-pin Amphenol connector 42, the 6-pin modular jack 43, or the like as a plug in accordance with the respective mode, are connected to the connecting terminals 31, 32, and 33, which are disposed on the expansion units 22a, 23a, and 24a, respectively.

Each of the communication cables 51, 52, and 53 is caused to pass through a portion where the sealing plate 15d of the guide member has been removed, and drawn out from the notch 11f or 12f formed in the side wall of the enclosure 10. In this case, the communication cable 53 connected to the connecting terminal 33 of the expansion unit 24a on the side distant from the notch 11f, 12f is caused to pass through a portion where the sealing plate 15d of the guide member 15 disposed between the plug-in section S on the lower left case and the plug-in section S on the lower right case has been cut out. In addition, an opening is not formed in the panel 14.

The communication device 1 having been configured as above is installed on a dedicated rack, or the like, in conjunction with related devices in a state of having small gaps between the devices. Even in such a case, in contrast with other communication devices which require opening of the cover 12 for replacement of the substrate unit 21, 22, 23, 24, and/or the like, the communication device 1 having the above-mentioned case enables forward withdrawal of the substrate units 21, 22, 23, and 24, which still remain in connection with the mother board 25, without involvement of opening of the cover 12 of the communication device 1 when maintenance, addition, or upgrading of a substrate unit, replacement of a substrate unit with another substrate unit of a different function, or the like, is performed. Accordingly, maintenance work during operation of the respective substrate units 21, 22, 23, and 24; checking of a connecting state after insertion and removal of the substrate unit 21, 22, 23, and/or 24; and the like, can performed readily.

In particular, the upper edges 15e of the guide members 15 guiding the substrate units 21, 22, 23, and 24 are supported on the guide projections 12e disposed on the cover 12. Therefore, the guide members 15 do not become unstable at a time of insertion and removal of the substrate units 21, 22, 23, and/or 24. In addition, since the guide members 15 are loosely fit in the guide projections 12e, the entire tray 16 on which the motherboard 25 and the substrate units 21, 22, 23, and 24 are mounted is loosely fit inside the box-shaped enclosure 10. Hence, according to the case, forward inclination of the entire tray 16 is prevented without disposal of special sliding rails, or the like, which may otherwise occur when the tray 16 is pulled out.

As described with reference to the embodiment, guide members for guiding a substrate unit are pulled out in conjunction with a motherboard. More specifically, the substrate unit can be pulled out to the outside of the enclosure in a state of being plugged into the motherboard. Accordingly, attachment and insertion/removal of the substrate unit to/from the motherboard are facilitated, along with wiring for the motherboard and the substrate unit. In addition, the enclosure exhibits excellent workability in checking of a connecting state and operations of the respective sections during maintenance.

The foregoing description of the embodiment of the invention has been presented for purposes of illustration and description. It is not intended to be exhaustive or to limit the invention to the precise form disclosed, and modifications and variations are possible in light of the above teachings or may be acquired from practice of the invention. The embodiment is chosen and described in order to explain the principles of the invention and its practical application program to enable one skilled in the art to utilize the invention in various embodiments and with various modifications as are suited to the particular use contemplated. It is intended that the scope of the invention be defined by the claims appended hereto, and their equivalents.

What is claimed is:

1. A case for electronic equipment, comprising:
   a chassis that includes at least a bottom plate of an enclosure having a box-shaped outer shell;
   a stay that holds a motherboard perpendicularly with respect to the bottom plate;
   guide members that are provided with slots for guiding a substrate unit to be perpendicularly plugged into the motherboard by way of a connector, the guide members being disposed on both sides for guiding the substrate unit, and being configured to pull out integrally with the motherboard towards a plug-in side from which the substrate unit is plugged in;
   a cover that includes at least a top cover side of the enclosure except for a portion corresponding to the bottom plate and a portion corresponding to the plug-in side;
   a panel attached to a position between the guide members corresponding to the substrate unit, the panel individually covering a plug-in section of the substrate unit;
   a front cover formed to edge around the panel and attached to the enclosure from outside the panel;
   a sealing plate disposed on one of the guide members located at an insertion end side, opposite the motherboard, the sealing plate preventing insertion in a direction crossing one of the guide members; and
   a notch formed at a position corresponding to the sealing plate located closer to the front cover, the notch establishing mutual communication between an inside and an outside of the enclosure,
   wherein the panel is provided with an opening that allows, when a communication cable is connected to the substrate unit to be connected to the motherboard from the front cover side, viewing of a connecting terminal into which a jack of the communication cable is to be plugged, and
   wherein when a communication cable extending from the substrate unit connected to the motherboard is drawn to the outside of the enclosure in a direction crossing the plug-in direction of the substrate unit, the communication cable is wired so as to cross over one of the guide members and the notch in a state in which the sealing plate is removed.

2. The case according to claim 1, wherein the cover has guide projections that are to be loosely fitted to upper edges of the guide members opposite the bottom plate.

3. The case according to claim 1, further comprising:
   a tray that slides over the chassis in a direction along which the substrate unit is to be plugged in,
   wherein the stay and the guide members are fixed to an upper surface of the tray.

4. The case according to claim 1, wherein the guide members are provided with the slot on either side face extending in a direction along which the substrate unit is to be plugged in.

5. The case according to claim 4, wherein a pair of the slots provided on the guide members forms a mirror image with respect to a guide center plane that is perpendicular to a plane extending along the substrate unit, and is imaginarily disposed at a center of the opposing guide members.

6. A case for electronic equipment, comprising:
a chassis that includes at least a bottom plate of an enclosure having a box-shaped outer shell;
a tray that is placed on the bottom plate and configured to be displaceable to be pulled to an outside of the enclosure along the bottom plate;
a stay that is fixed on the tray and supports a motherboard disposed perpendicularly with respect to a pulling direction of the tray;
guide members that are provided with slots for guiding a substrate unit to be perpendicularly plugged into the motherboard by way of a connector, the guide members being disposed on both sides for guiding the substrate unit and being fixed to the tray;
a cover that includes at least a top cover side of the enclosure except for a portion corresponding to the bottom plate and a portion corresponding to the pulling direction side of the tray;
a panel attached to a position between the guide members corresponding to the substrate unit, the panel individually covering a plug-in section of the substrate unit;
a front cover formed to edge around the panel and attached to the enclosure from outside the panel;
a sealing plate disposed on one of the guide members located at an insertion end side, opposite the motherboard, the sealing plate preventing insertion in a direction crossing one of the guide members; and
a notch formed at a position corresponding to the sealing plate located closer to the front cover, the notch establishing mutual communication between an inside and an outside of the enclosure,
wherein the panel is provided with an opening that allows, when a communication cable is connected to the substrate unit to be connected to the motherboard from the front cover side, viewing of a connecting terminal into which a jack of the communication cable is to be plugged, and
wherein when a communication cable extending from the substrate unit connected to the motherboard is drawn to the outside of the enclosure in a direction crossing the plug-in direction of the substrate unit, the communication cable is wired so as to cross over one of the guide members and the notch in a state in which the sealing plate is removed.

7. A case for electronic equipment, comprising:
a box-shaped outer shell that accommodates an electronic equipment in which a substrate unit is perpendicularly plugged into a motherboard by way of a connector;
a chassis that includes a bottom plate of the outer shell;
guide members that are provided with slots for guiding the substrate unit to the motherboard disposed perpendicularly with respect to the bottom plate, the guide members being configured to move in conjunction with the motherboard along a plug-in direction of the substrate unit;
a cover that includes a portion of the outer shell, except for a portion corresponding to a bottom plate side and a portion corresponding to a plug-in direction side of the substrate unit, the cover covering the motherboard and the substrate unit;
a panel attached to a position between the guide members corresponding to the substrate unit, the panel individually covering a plug-in section of the substrate unit;
a front cover formed to edge around the panel and attached to the outer shell from outside the panel;
a sealing plate disposed on one of the guide members located at an insertion end side, opposite the motherboard, the sealing plate preventing insertion in a direction crossing one of the guide members; and
a notch formed at a position corresponding to the sealing plate located closer to the front cover, the notch establishing mutual communication between an inside and an outside of the outer shell,
wherein the panel is provided with an opening that allows, when a communication cable is connected to the substrate unit to be connected to the motherboard from the front cover side, viewing of a connecting terminal into which a jack of the communication cable is to be plugged, and
wherein when a communication cable extending from the substrate unit connected to the motherboard is drawn to the outside of the enclosure in a direction crossing the plug-in direction of the substrate unit, the communication cable is wired so as to cross over one of the guide members and the notch in a state in which the sealing plate is removed.

8. A communication device, comprising:
a chassis that includes at least a bottom plate of an enclosure having a box-shaped outer shell;
a tray that is placed on the bottom plate and configured to be displaceable to be pulled to an outside of the enclosure along the bottom plate;
a cover that includes at least a top cover side of the enclosure except for a portion corresponding to the bottom plate and a portion corresponding to the pulling direction side of the tray;
a motherboard that is disposed perpendicularly with respect to the pulling direction of the tray;
a stay that is fixed to the tray and supports the motherboard;
a substrate unit that is perpendicularly plugged into the motherboard by way of a connector;
guide members that are provided with slots for guiding the substrate unit, the guide members being disposed on both sides for guiding the substrate unit and being fixed to the tray;
a panel that is attached to a position between a pair of the guide members corresponding to the single substrate unit, the panel individually covering a plug-in section of the substrate unit;
a front cover that is formed to edge around the panel and is attached to the enclosure from outside of the panels;
a sealing plate that is disposed on the guide member located at an insertion end side, opposite the motherboard, the sealing plate preventing insertion in a direction crossing the guide member; and
a notch that is formed at a position corresponding to the sealing plate located closer to the front cover, the notch establishing mutual communication between an inside and an outside of the enclosure,
wherein the panel is provided with an opening that allows, when a communication cable is connected to the substrate unit to be connected to the motherboard from the front cover side, viewing of a connecting terminal into which a jack of the communication cable is to be plugged, and
wherein when a communication cable extending from the substrate unit connected to the motherboard is drawn to the outside of the enclosure in a direction crossing the plug-in direction of the substrate unit, the communication cable is wired so as to cross over the guide member and the notch in a state in which the sealing plate is removed.

9. The communication device according to claim 8, wherein the communication device is provided with a plurality of the substrate units,
- wherein one of the substrate units is a control unit that controls the remaining substrate units by way of the motherboard,
- wherein the remaining substrate units are expansion units that are formed so as to be shorter than the control unit in the plug-in direction and are connected to the motherboard by way of connectors having shape identical with each other,
- wherein when the communication cable is connected to the expansion unit from a front side where the front cover is provided, the communication device is provided with an auxiliary substrate that allows the connecting terminal provided on the expansion units to reach the panel, and
- wherein when the communication cable extending from the expansion unit is caused to pass through the notch in a direction crossing the plug-in direction of the substrate unit, to thus be drawn to the outside of the enclosure, the respective expansion units are directly plugged into said motherboard.

10. The communication device according to claim 9, wherein the auxiliary substrate is an extension substrate that connects the motherboard to the expansion unit and allows the connecting terminal provided on the expansion units to reach the panel.

11. The communication device according to claim 9, wherein the auxiliary substrate is a terminal-converting substrate that converts a connecting terminal of the expansion unit into a connecting terminal assigned to a jack of the communication cable connected to the front side and which is provided in such a length as to allow the connecting terminal provided on the expansion units to reach the panel.

* * * * *